US011862444B2

(12) United States Patent
Franzke et al.

(10) Patent No.: US 11,862,444 B2
(45) Date of Patent: Jan. 2, 2024

(54) TARGET MATERIAL FOR DEPOSITION OF MOLYBDENUM OXIDE LAYERS

(71) Applicant: PLANSEE SE, Reutte (AT)

(72) Inventors: Enrico Franzke, Reutte (AT); Harald Koestenbauer, Reutte (AT); Joerg Winkler, Reutte (AT); Dominik Lorenz, Reutte (AT); Thomas Leiter, Reutte (AT)

(73) Assignee: Plansee SE, Reutte (AT)

(*) Notice: Subject to any disclaimer, the term of this patent is extended or adjusted under 35 U.S.C. 154(b) by 336 days.

(21) Appl. No.: 16/753,898

(22) PCT Filed: Sep. 5, 2018

(86) PCT No.: PCT/EP2018/073811
§ 371 (c)(1),
(2) Date: Apr. 6, 2020

(87) PCT Pub. No.: WO2019/068406
PCT Pub. Date: Apr. 11, 2019

(65) Prior Publication Data
US 2020/0255341 A1  Aug. 13, 2020

(30) Foreign Application Priority Data
Oct. 6, 2017 (EP) .................. 17001644

(51) Int. Cl.
*H01J 37/34* (2006.01)
*C23C 14/34* (2006.01)
(Continued)

(52) U.S. Cl.
CPC ........ *H01J 37/3429* (2013.01); *C04B 35/495* (2013.01); *C04B 35/645* (2013.01);
(Continued)

(58) Field of Classification Search
CPC .............. H01J 37/3426; H01J 37/3429; C23C 14/3414; C04B 35/495; C04B 2235/3256; C04B 2235/3251
See application file for complete search history.

(56) References Cited

U.S. PATENT DOCUMENTS 6,193,856 B1  2/2001  Kida et al.
6,743,343 B2  6/2004  Kida et al.
(Continued)

FOREIGN PATENT DOCUMENTS

CN   104919340 A     9/2015
CN   107162057 A  *  9/2017  ............. C01G 39/02
(Continued)

OTHER PUBLICATIONS

Machine Translation CN107162057A (Year: 2017).*
(Continued)

*Primary Examiner* — Michael A Band
(74) *Attorney, Agent, or Firm* — Laurence A. Greenberg; Werner H. Stemer; Ralph E. Locher

(57) ABSTRACT

An electrically conductive, oxidic target material includes a proportion of substoichiometric molybdenum oxide phases of at least 60% by volume, an $MoO_2$ phase in a proportion of 2-20% by volume, and optionally an $MoO_3$ phase in a proportion of 0-20% by volume. The substoichiometric molybdenum oxide phase proportion is formed by one or more substoichiometric $MoO_3$-y phase(s), where y is in each case in a range from 0.05 to 0.25. A process for producing the target material and a process for using the target material are also provided.

10 Claims, 11 Drawing Sheets

(51) Int. Cl.
    *C23C 14/08* (2006.01)
    *C04B 35/495* (2006.01)
    *C04B 35/645* (2006.01)
(52) U.S. Cl.
    CPC ........ *C04B 35/6455* (2013.01); *C23C 14/083* (2013.01); *C23C 14/3414* (2013.01); *C23C 14/3485* (2013.01); *H01J 37/3426* (2013.01); *C04B 2235/3251* (2013.01); *C04B 2235/3256* (2013.01); *C04B 2235/5436* (2013.01); *C04B 2235/604* (2013.01); *C04B 2235/666* (2013.01)

(56) References Cited

U.S. PATENT DOCUMENTS

| | | | | |
|---|---|---|---|---|
| 7,601,182 | B2* | 10/2009 | Shembel | H01M 4/364 429/188 |
| 7,754,185 | B2* | 7/2010 | McHugh | C01G 39/02 419/49 |
| 10,487,392 | B2 | 11/2019 | Schlott et al. | |
| 2006/0165572 | A1 | 7/2006 | McHugh et al. | |

FOREIGN PATENT DOCUMENTS

| | | |
|---|---|---|
| DE | 102012112739 A1 | 4/2014 |
| DE | 102014111935 A1 | 2/2016 |
| EP | 0852266 A1 | 7/1998 |
| EP | 2669718 A1 | 12/2013 |
| JP | 2013020347 A | 1/2013 |
| TW | 201608042 A | 3/2016 |

OTHER PUBLICATIONS

Derwent Abstract WO 2008031122 A1 (Year: 2008).*
Kuhaili, M.; Durrani, S.; Khawaja, E. "Effects of preparation conditions and thermcoloration on the optical properties of thin films of molybdenum oxide". Thin Solid Films, vol. 408. pp. 188-193. (Year: 2002).*
Dieterle M. et al.: "Raman spectroscopy of molybdenum oxides—Part I. Structural characterization of oxygen defects in MoO3_x by DR UV/VIS Raman spectroscopy and X-ray diffraction", Phys. Chem. Chem Phys., 2002, 4, pp. 812-821, DOI: 10.1039/b107012f.
Brewer L. et al.: "Molybdenum-Tin Alloy Phase Diagram (based on 1990 Brewer L.)", ASM Alloy Phase Diagrams Center, 2007, pp. 1-3, DOI: 10.1361/apd-mo-sn-901661.
Pachlhofer J. et al.: "Industrial-scale sputter deposition of molybdenum oxide thin films: Microstructure evolution and properties", J. Vac. Sci. Technol. A 35(2), Mar./Apr. 2017, pp. 021504-1-021504-8.
Pachlhofer J. et al.: "Reactive and non-reactive sputter deposition of MoOx thin films", International Conference on Rapidly Quenched and Metastable Materials, Aug. 27- Sep. 1, 2017, Leoben, Austria, pp. 1-28.
Schmidt H. et al.: "Non-reactive sputter deposition of Mo- and W-oxide films from ceramic targets: Process conditions and thin film properties", Asian-European International Conference on Plasma Surface Engineering AEPSE 2017, Jeju Island, South Korea, Sep. 14-16, 2017.
Pachlhofer J. et al.: "Structure-Property Relations in Reactively Sputtered Molybdenum Oxide Thin Films", ICMCTF 2015 (42th Intl. Conf. Metallurgical Coatings & Thin Films), Apr. 20-24, 2015, San Diego, CA, USA.
Koestenbauer H et al.: "Optimization of Molybdenum Oxides for Low-Reflectance Thin Films using Numerical Simulation", 2015 SID International Symposium Digest of Technical Papers, SID Display Week 2015, Jun. 2-5, 2015, San Jose, CA, pp. 1741-1743.
Koestenbauer H et al.: "Doped Molybdenum Oxides for Low-Reflectance Thin Films in Touch Sensor Applications", Society of Vacuum Coaters SVC Conference, Apr. 20-25, 2015, Santa Clara, USA, pp. 1-4.
Schmidt H. et al.: "Sputtered Molybdenum-Oxide for Anti-Reflection Layers in Displays: Optical Properties and Thermal Stability", International Conference on Display Technology 2018, Guangzhou, China, Apr. 9-12, 2018, pp. 225-229.
Pachlhofer J. et al.: "Non-reactive de magnetron sputter deposition of Mo—O thin films from ceramic MoOx targets", Surface and Coatings Technology, (Mar. 18, 2017), vol. 332, doi:10.1016/JJ.SURFCOAT.2017.07.083 ISSN 0257-8972, pp. 80-85, XP085293368.
Okamoto H.: "Supplemental Literature Review of Binary Phase Diagrams: Ag—Yb, Al—Co, Al—I, Co—Cr, Cs—Te, In—Sr, Mg—TI, Mn—Pd, Mo—O, Mo—Re, Ni—Os, and V—Zr", Journal of Phase Equilibria and Diffusion, Springer New York LLC, US, vol. 37, No. 6, doi:10.1007/S11669-016-0487-6, ISSN 1547-7037, (Jul. 18, 2016), pp. 726-737.
Monk P. et al., "The effect of doping electrochromic molybdenum oxide with other metal oxides: Correlation of optical and kinetic properties", Solid State Ionics, North Holland Pub. Company, Amsterdam NL, (Aug. 1, 1995), vol. 80, No. 1, doi:10.1016/0167-2738(95)00130-X, ISSN 0167-2738, pp. 75-85, XP004050297.
Pachlhofer J. et al.: "Non-reactive and Reactive DC Magnetron Sputter Deposition of Molybdenum Oxide Thin Films", 44th International Conference on Metallurgical Coatings and Thin Films (ICMCTF), 2017, San Diego, USA.

* cited by examiner

FIG. 7

TARGET MATERIAL FOR DEPOSITION OF MOLYBDENUM OXIDE LAYERS

BACKGROUND OF THE INVENTION

Field of the Invention

The present invention relates to an electrically conductive target material comprising molybdenum oxide, a process for the production thereof and also a use of the target material. Target materials comprising molybdenum oxide ($MoO_x$) are used in cathode atomization plants such as PVD (PVD=physical vapour deposition) coating plants in order to deposit molybdenum oxide-containing layers from the gas phase in a vacuum process. In this coating process (sputtering process), the layer-forming particles are transferred from the (sputtering) target into the gas phase and a corresponding molybdenum oxide-containing layer is formed on the substrate to be coated by condensation of these particles, optionally with introduction of oxygen as reactive gas ("reactive sputtering").

Molybdenum oxide layers, the properties of which can optionally be modified by addition of doping elements, have interesting optical properties and are therefore employed, in particular, in layer structures in optical or optoelectronic applications such as electronic displays. An example of the use of molybdenum oxide layers may be found in JP2013020347 where metallic conductor tracks within the display of a capacitive touch screen are covered by a light-absorbing layer of $MoO_x$ in order to suppress undesirable reflections from the metallic conductor tracks.

Important properties such as degree of light absorption, light reflection, light transmission, etching rate (relevant in subsequent structuring of the deposited layers by means of photolithography in combination with a wet-chemical etching process), thermal stability and stability to further chemicals used in the manufacturing process (for example stability to photoresist developer or remover) depend on the precise stoichiometric composition x of the deposited $MoO_x$ layer and the added doping elements. In many applications, for example in the capacitive touch screen mentioned above, there is a requirement for $MoO_x$ layers in which the molybdenum oxide is present with a substoichiometric composition, i.e. the oxide has unoccupied oxygen valencies and oxygen vacancies are present in the deposited $MoO_x$ layer. In particular, substoichiometric $MoO_x$ layers having an x range from $MoO_{2.5}$ to $MoO_{2.98}$ are of particular interest for such applications because of their electrooptical properties. They absorb light in the visible wavelength range and are at the same time still sufficiently electrically conductive (sheet resistance<20 k$\Omega$/□ or <20 k$\Omega$/square); they are generally semiconducting.

The simplest way of producing such substoichiometric $MoO_x$ layers is based on a metallic molybdenum target which is reactively sputtered in an appropriately set argon and oxygen gas atmosphere so that not only molybdenum but also oxygen atoms are incorporated in the deposited layer. In order to achieve layers having homogeneous properties, in particular in respect of layer thickness and stoichiometry (i.e. oxygen content and dopant concentration) an atmosphere having a precise oxygen concentration which is uniform over time and space has to be provided in the environment of the substrate during reactive sputtering. This can be achieved only by means of very complicated and expensive process technology and is therefore associated with correspondingly high costs. In addition, hysteresis effects which are disadvantageous in terms of process stability occur during reactive sputtering when the oxygen partial pressure is changed (e.g. when starting-up the plant).

Apart from metallic targets, oxide-ceramic target materials such as $MoO_2$ targets (US 2006/0165572 A1) or target materials having a substoichiometric composition (DE10 2012 112 739 and EP 0 852 266 A1) are known. US 2006/0165572 A1 discloses a target material comprising at least 99% by weight of $MoO_2$. However, this target material comprises two little oxygen to be able to deposit $MoO_x$ layers with x>2 therewith without additional oxygen as reactive gas.

DE10 2012 112 739 discloses an $MoO_x$ target material having a substoichiometric composition, where the composition of the target material approximates the stoichiometry in the layer to be deposited. However, for the fine adjustment of the layer stoichiometry, a further introduction of oxygen is necessary, even though this is smaller than in the case of a metal target or an $MoO_2$ target, and this can, as mentioned above, have a disadvantageous effect on the quality of the deposited layers. Details of the microstructure of the $MoO_x$ target material used are absent. In addition, the achievable relative densities of the target material are extremely disadvantageous. A relative density of 85% is indicated for the working example of a substoichiometric oxide Nb—Mo—$O_x$. However, target materials having a very high relative density, in particular >95%, are wanted by the operators of coating plants in order to reduce the risk of arc discharges in the coating process, which can bring about undesirable particle formation in the deposited layer.

EP 0 852 266 B1 relates quite generally to sputtering targets composed of substoichiometric metal oxides; an $MoO_{2.95}$ target material is mentioned in Example 16 as only specific example comprising molybdenum. Specific information on the microstructure of the target and the starting powder used for production of the target material are absent. It would be obvious that a partially reduced $MoO_3$ powder or a powder mixture having a very high (>90% by weight) proportion of $MoO_3$ was used. For production of the target, reference is made only to the production process for a target which has been produced from $Nb_2O_5$ powder and was compacted by means of hot pressing at temperatures in the range 1100-1400° C., a hold time of 1 hour and an applied pressure of 50 kg/cm$^2$. It is completely unclear how these $Nb_2O_5$ process conditions can be applied to the production of a compact $MoO_{2.95}$ target since the melting point of $MoO_3$ is only 795° C. and the powder would therefore have completely liquefied in the temperature range purportedly used. The plasma spraying briefly indicated in EP 0 852 266 B1 is not suitable for the production of $MoO_x$ target material having the required high relative densities of above 95%. In experiments carried out by the applicant, $MoO_x$ target material having only relative densities in the range 85-90% could be achieved by means of plasma spraying.

Although the oxygen content of a deposited layer is proportional to the oxygen content x of the target material $MoO_x$, it is critically dependent on the size, geometry and structural configuration of the coating plant (for example on the target-substrate distance or on the position of the vacuum chamber extraction or the position of the Ar sputtering gas inlet). In order to produce a layer having a desired oxygen content, individual targets having different oxygen contents are required in different plants. The manufacturers of target materials therefore have to meet the additional requirement that the oxygen content of the target material can be adjusted over a very wide concentration range in very fine steps or at best continuously (analogously).

SUMMARY OF THE INVENTION

It is an object of the present invention to further develop a target material for the cathode atomization of $MoO_x$ layers so that high-quality layers having a uniform layer thickness and homogeneous composition can be deposited. The target material should have a very high density in order to ensure good process stability and a low tendency for particles to be formed. The target material should also be adjustable in a wide range of the parameter x, in particular for $2.53 \leq x \leq 2.88$, for the substoichiometric composition of $MoO_x$. For it to be able to be used in DC (direct current) sputtering processes or in pulsed DC sputtering processes, the target material also has to be electrically conductive, i.e. its specific resistance should be less than 10 Ohm cm, or the specific electrical conductivity should be greater than 10 S/m. Furthermore, a production process for such a molybdenum oxide target material and also a use of the latter should be provided.

The object is achieved by electrically conductive, oxidic target material comprising:
- a proportion of a substoichiometric molybdenum oxide phase of at least 60% by volume, based upon the total volume of solid material in the oxidic target material, which is formed by one or more substoichiometric $MoO_{3-y}$ phase(s), where y is in each case in the range of from 0.05 to 0.25,
- an $MoO_2$ phase in a proportion of 2-20% by volume, based upon the total volume of solid material in the oxidic target material,
- optionally an Moos phase in a proportion of 0-20% by volume, based upon the total volume of solid material in the oxidic target material, by a process for producing the electrically conductive, oxidic target material, the process comprising the following steps:
- providing a molybdenum oxide-containing powder or a molybdenum oxide-containing powder mixture having an oxygen content matched to the target material to be produced;
- introducing the powder mixture into a mold; and
- densifying the powder mixture by at least one of pressure and heat, and by a sputtering process for using the electrically conductive, oxidic target material for vapor deposition of a molybdenum oxide-containing layer, wherein the sputtering process is carried out as a DC sputtering process or a pulsed DC sputtering process in a noble gas atmosphere without oxygen or with introduction of not more than 20% by volume of oxygen as reactive gas. Advantageous developments of the invention are set forth in the dependent claims.

The oxide-ceramic target material according to the invention is electrically conductive. It displays a homogeneous structure on a macroscopic scale, while on a microscopic scale it is made up of at least two different molybdenum oxide phases: apart from an $MoO_2$ phase in a proportion of 2-20% by volume, it has a substoichiometric molybdenum oxide phase in a proportion of at least 60% by volume. The proportion of substoichiometric molybdenum oxide phase is in particular 60-98% by volume. The substoichiometric molybdenum oxide phase proportion is formed by one or more substoichiometric $MoO_{3-y}$ phase(s), where y is in each case in the range from 0.05 to 0.25. The target material can optionally further comprise an $MoO_3$ phase in a proportion of 0-20% by volume. Apart from the molybdenum oxides, production-related impurities such as tungsten (W), sodium (Na), potassium (K), antimony (Sb), vanadium (V), chromium (Cr), iron (Fe), carbon (C) and nitrogen (N) can be present in the target material; the amount of such impurities is typically below 1000 ppm. These production-related, very minor impurities will hereinafter be disregarded in the analysis of the microstructure of the target material and not taken into account further (e.g. not regarded as separate phase). The reported proportions by volume of the various molybdenum oxide phases are normalized and relative volumes based on the total volume taken up by the particles (grains) of the target material; the volume taken up by the pores of the target material is excluded from this total volume. The volumes reported for the individual molybdenum oxide phases therefore alone add up to 100% without the pore volume.

The target material which consists of a plurality of phases on a microscopic scale has the following critical advantages:

The coexistence of at least two phases, namely an $MoO_2$ phase and at least one substoichiometric $MoO_{3-y}$ phase, creates an additional degree of freedom in respect of the oxygen content of the target material. The oxygen content x of the target material $MoO_x$ (and associated therewith the oxygen content of the deposited layer) can be varied very finely and set precisely in a broad parameter range of $2.53 \leq x \leq 2.88$, in particular in the economically particularly important range of $2.6 < x < 2.8$, via the ratio of amounts of the coexisting phases relative to one another. Such variation of the oxygen content of the target material is not possible in the prior art, in which the target material is present in only one phase, since the oxygen content x of the target material $MoO_x$ is restricted to a small number of discrete values: x=2 in the case of an $MoO_2$ target material, x=2.75 in the case of $Mo_4O_{11}$ target material, x=2.76 in the case of $Mo_{17}O_{47}$, x=2.8 in the case of $Mo_5O_{14}$; x=2.875 in the case of $Mo_8O_{23}$, x=2.89 in the case of $Mo_9O_{26}$ and x=2.89 in the case of $Mo_{18}O_{62}$. The Mo oxides listed here are those which are mentioned most frequently in the specialist literature. The existence of further Mo oxides which have not been described or not yet discovered cannot be ruled out here. In the prior art, finer adjustment of the oxygen content x of the deposited layers can be carried out only by means of introduced oxygen as reactive gas.

For many applications, the target material has a sufficient oxygen content for the introduction of additional oxygen not to be absolutely necessary in the coating process. The coating process can therefore be carried out using pure noble gas (in general argon) as process gas. The disadvantages associated with reactive sputtering (complicated process technology and procedure, potential inhomogeneities in the deposited layer) can therefore be avoided. It should be noted that when the target material is used in a pure noble gas atmosphere without additional introduction of oxygen, the oxygen content of the deposited molybdenum oxide layer is somewhat lower than the oxygen content of the target material used. This is attributable to the fact that, in the sputtering process in which the sputtering target is broken down into its individual atomic components such as molybdenum atoms, free radicals and ions, oxygen atoms, free radicals and ions and also neutral and charged molybdenum-oxygen clusters, the oxygen species as lighter and therefore more mobile components partially recombine to form oxygen molecules ($O_2$). Part of these oxygen molecules formed by recombination is pumped out from the process region via the vacuum pump and in this way is lost for incorporation into the layer to be deposited. This slight oxygen depletion can be compensated for by use of a molybdenum oxide target which has a correspondingly higher oxygen content than the layer to be deposited.

Even when the multiphase target material is used in a reactive sputtering process, it offers advantages over the target materials known in the prior art. In the target material according to the invention, the additionally required oxygen is generally significantly less since the oxygen content of the target material can be set significantly more precisely over a wide parameter range for the desired composition in the layer. The disadvantages of reactive sputtering (hysteresis effects, potential inhomogeneities in the deposited layer) are less pronounced at a lower oxygen partial pressure and therefore occur to a decreased extent when the target material according to the invention is used.

Particularly $MoO_2$ and the substoichiometric $MoO_{3-y}$ phases contribute to the abovementioned advantageous properties of the target material. Compared to the other molybdenum oxide phases, $MoO_2$ is distinguished by a very high electrical conductivity of $1.25 \times 10^6$ S/m. The substoichiometric $MoO_{3-y}$ phases likewise each have a very high electrical conductivity (monoclinic $Mo_4O_{11}$: $1.25 \times 10^6$ S/m), or are electrically semiconducting (electrical conductivity values: $Mo_{17}O_{47}$: >2000 S/m; $Mo_8O_{23}$: 83 S/m; $Mo_{18}O_{52}$: 0.4 S/m; $Mo_9O_{26}$: 27 S/m). The substoichiometric $MoO_{3-y}$ phases, in particular $Mo_4O_{11}$, also have very good sintering properties, which assists sintering of the starting powder used to form a compact component even at low temperatures. Both $MoO_2$ and the substoichiometric $MoO_{3-y}$ phases also have a low partial vapour pressure. The vapour pressure is an important process parameter in the coating process; a low vapour pressure contributes to the stability of the coating process.

The $MoO_3$ which is optionally present in the target material of the invention has a relatively high oxygen content and thus helps to realize target materials having a very small oxygen substoichiometry (i.e. an $MoO_x$ target material with x close to 3). $MoO_3$ has an orthorhombic structure characteristic of $MoO_3$. For the purposes of the present invention, $MoO_3$ also refers to a substoichiometric molybdenum oxide $MoO_{3-y}$ having very few oxygen vacancies (0<y<0.05), which is likewise present in an orthorhombic $MoO_3$ structure and differs from $MoO_3$ having the precise stoichiometry only by a few isolated oxygen vacancies. For example, $MoO_{2.96}$, which has an orthorhombic $MoO_3$ structure and compared to precisely stoichiometric $MoO_3$ has a few isolated oxygen vacancies is also considered to be $MoO_3$ for the purposes of the present invention. The degree of reduction of the molybdenum oxide can be estimated from the intensity ratio of the two Raman wagging vibrations at 285 and 295 cm$^{-1}$ (cf. Phys. Chem. Chem. Phys., 2002, 4, 812-821). $MoO_3$ likewise displays good sintering properties, but $MoO_3$ is, in contrast to the other $MoO_x$ phases, electrically insulating (the conductivity of α-$MoO_3$ is only $1 \times 10^{-6}$ S/m) and is additionally water-soluble. A target material comprising an electrically insulating phase such as $MoO_3$ which is embedded in an electrically semiconducting or electrically conductive matrix tends to "arcing" (arc discharges) in the sputtering process and comparatively many particles ("splashes") are embedded in the deposited layers. In addition, the waters solubility of $MoO_3$ makes the mechanical working of the target material more difficult. Mechanical working steps such as grinding, cutting, turning therefore usually have to be carried out "dry", i.e. without cooling lubricant, as a result of which the machining rate is significantly reduced and costs for these process steps increase. Furthermore, $MoO_3$ has a high vapour pressure and at temperatures above 700° C. tends to sublime, which is disadvantageous for the production and compacting process. Furthermore, there is a risk of $MoO_3$ subliming selectively during use of the sputtering target in the coating process, and the phase composition of the target is altered in this way during operation. For these reasons, $MoO_3$ should therefore be avoided in the target material where possible. In a preferred embodiment, the proportion of the $MoO_3$ phase is 1% by volume. $MoO_3$ is particularly preferably in at most traces in the target material and is in particular not detectable in the target material.

Preference is given to a substoichiometric molybdenum oxide being predominantly the main constituent of the target material: the proportion of the substoichiometric molybdenum oxide phase in the target material is, according to one embodiment, at least 85% by volume, and is in particular in the range 85-98% by volume. The proportion of the $MoO_2$ phase is preferably in the range 2-15% by volume. In an advantageous embodiment, the proportion of the $MoO_2$ phase is in particular in the range 2-7% by volume, while the proportion of the substoichiometric molybdenum oxide phase is in the range 93-98% by volume.

The substoichiometric $MoO_{3-y}$ phase(s) present in addition to the $MoO_2$ phase and the optional $MoO_3$ phase can be, in particular, $Mo_4O_{11}$ (corresponds to y=0.25), $Mo_{17}O_{47}$ (y=0.24), $Mo_5O_{14}$ (y=0.2), $Mo_8O_{23}$ (y=0.125), $Mo_9O_{26}$ (y=0.11) or $Mo_{18}O_{52}$ (y=0.11). $Mo_4O_{11}$ can be present either as n oxide in a monoclinic crystal structure (low-temperature form) or as y oxide having rhombic crystal structure (high-temperature form). $Mo_{17}O_{47}$, $Mo_5O_{14}$, $Mo_{18}O_{52}$ are also referred to as Magnéli phases. The binary phase diagram of the molybdenum-oxygen system is shown in FIG. 1.

It has been found that both a high electrical conductivity and a high density were able to be achieved for the advantageous target material indicated above (proportion of substoichiometric molybdenum oxide phase in the range 85-98% by volume, proportion of the $MoO_2$ phase in the range 2-15% by volume). Excellent properties in respect of, in particular, achievable density can be achieved using target materials which comprise at least 45% by volume of the substoichiometric phase $Mo_4O_{11}$.

The determination of the proportions by volume of the various molybdenum oxide phases and the density of the target material are carried out on a representative cross section of a sample, with, as is customary in the technical field, volume figures being derived from proportions by area measured on the surface of the section. A metallographic polished section of the sample is produced by dry preparation and subsequently analysed under an optical or electron microscope, with additional analytical methods such as Raman spectrometry or, when using a scanning electron microscope, a backscatter electron detector (BSE detector) being required for positionally resolved determination of the molybdenum oxide phases. The method of determining the proportions of molybdenum oxide phases used in the following working examples is based on Raman microscopy in which the sample surface to be analysed is scanned pointwise by means of a laser beam and a complete Raman spectrum is produced for each measurement point ("Raman mapping"). By comparison of the resulting Raman spectrum for each measurement point with reference spectra of individual, pure molybdenum oxides or substoichiometric molybdenum oxides, each measurement point is assigned a corresponding molybdenum oxide phase and a two-dimensional picture of the phase composition of the sample is produced in this way, and the proportions by area, and thus the proportions by volume, of the various phases can then be calculated therefrom.

Apart from the molybdenum oxide phases, one or more dopants can be additionally present in a total molar proportion of not more than 20 mol % in the target material. The term dopant refers to a metal other than molybdenum present in metallic or oxidic form; the proportion of a single dopant in the target material is in the range from 0.5 mol % to 20 mol %. The molar amounts indicated relate to the amount of the optionally oxidically bound metal and not to the amount of any metal oxide. The dopant serves to modify the layer produced by means of the target material in a targeted manner and is distinctly different, because of its molar proportion of at least 0.5 mol % alone, from the abovementioned production-related impurities whose typical concentration is in the range of not more than 1000 ppm. At molar proportions of up to 20 mol %, the dopant is present in significantly higher concentrations than, for example, customary in semiconductor electronics. Relatively high dopant concentrations (>2 mol %) can be determined quantitatively by means of X-ray fluorescence analysis (XRF) or EDX detector (energy-dispersive X-ray spectroscopy) in a scanning electron microscope (SEM), while lower concentrations can be determined quantitatively by means of inductively coupled plasma mass spectrometry (ICP-MS).

As dopant, it is possible to select, in particular, one or more metals from the group consisting of tantalum, niobium, titanium, chromium, zirconium, vanadium, hafnium, tungsten. Tantalum (Ta), niobium (Nb) or a mixture of niobium and tantalum are preferred dopants by means of which the corrosion rate of the deposited layers can be modified without the electrooptical properties being adversely affected. Pure molybdenum oxide layers generally have a corrosion rate which is too high. The corrosion rate of the deposited layer decreases with increasing proportion of tantalum or niobium.

The dopant is preferably present in oxidically bound form in the target material. A molybdenum oxide target material having an oxidically bound dopant is usually preferred to a target material in which the dopant is present as metallic admixture since the electrical conductivity of the metal usually differs significantly (by one or more orders of magnitude) from the electrical conductivity of the various molybdenum oxides. Such a target material having greatly different electrical conductivities tends to arcing or particle formation during the coating process and is relatively unsuitable for the deposition of high-quality, particle-free thin layers.

The oxidically bound dopant can form a mixed phase with the molybdenum oxides. The dopant can also be present at least partly as separate oxide phase which is embedded in the form of domains in the remaining molybdenum oxide target material. The oxide phase can be formed at least partly by stoichiometric or substoichiometric oxides of the dopant and/or mixed oxides of the dopant with molybdenum.

For the example of tantalum as dopant, the dopant can at least partly be present as separate phase composed of tantalum oxide, in particular composed of $Ta_2O_{5-y}$ where $0 \leq y \leq 0.05$.

For the example of niobium as dopant, the dopant can be present at least partly as separate phase composed of niobium oxide, in particular composed of $Nb_2O_{5-y}$ where $0 \leq y \leq 0.05$.

In a preferred embodiment, the substoichiometric molybdenum oxide phase is present as matrix in which the further phases are embedded. The proportion of substoichiometric molybdenum oxide phase in this case runs through the target material in a contiguous, percolating network in which island regions (domains) comprising the further molybdenum oxide phases ($MoO_2$, optionally $MoO_3$) or optionally domains containing dopants are present. In the metallographic polished section, the domains are discernible as areas. This percolating microstructure has a positive influence on the electrical conductivity of the target. The domains typically have an extension in the order of magnitude of 100 µm, and in the case of a relatively large proportion of $MoO_3$ the domains comprising $MoO_3$ phase can also be somewhat larger (with an extension of up to 300 µm). If a plurality of substoichiometric $MoO_{3-y}$ phases are present, a contiguous, percolating network can be formed by the various substoichiometric molybdenum oxide phases together or else solely by the substoichiometric molybdenum oxide phase which is present in the greatest amount, in particular by $Mo_4O_{11}$. On a macroscopic scale, the three-dimensional structure of the target material is substantially isotropic, i.e. there is no directional dependence of the materials properties.

The multiphase approach according to the invention makes it possible to achieve target materials having a high relative density, in particular a relative density of at least 95%, in particular at least 98%. The relative density of the target material is preferably at least 99%. The relative density of the target material is particularly advantageously at least 99.5%. A compact target material having a higher relative density is important for the quality of the deposited layers since less dense target materials lead, owing to their higher porosity, to a less stable and difficult-to-control deposition process (in the case of target materials having a relative density which is too low, there is the risk of arc discharges which generally lead to undesirable particle formation in the deposited thin layer). In addition, target materials having a relative density which is too low tend to absorb water or other impurities, which can likewise lead to a more difficult-to-control coating process. The relative density is determined by means of digital image analysis with the aid of optical micrographs of the metallographic polished section, in which the relative proportion by area of the pores (i.e. proportion by area of the pores relative to the total area examined) is evaluated. The density is calculated as arithmetic mean from three such porosity measurements.

The electrical conductivity of the target material is preferably at least 10 S/m. The electrical conductivity can be measured by means of commercially available instruments by transport measurement, for example a four-point measurement. At a relatively high electrical conductivity, the deposition rate and the process stability can be increased and the costs for the coating process can be reduced.

In a preferred embodiment, the oxygen content of the target material is in the range from 71.4 to 74.5 at. %, in particular from 72 to 74 at. %. The oxygen content can, for example, be determined by means of an EDX detector (energy-dispersive X-ray spectroscopy) in a scanning electron microscope (SEM) or by hot extraction analysis (carrier gas hot extraction) in which the Mo oxide sample to be analysed is "diluted" in a ratio of from 1:10 to 1:1000 with metallic molybdenum whose oxygen content (blank) has previously been determined in a separate measurement. In this way, molybdenum oxide layers comprising up to 74 at. % of oxygen can, depending on the size and structural configuration of the coating plant used, be produced without additional introduction of oxygen during the coating process.

The invention also relates to a production process for the above-described target material. To produce such a target material, a molybdenum oxide-containing powder or a molybdenum oxide-containing powder mixture having an oxygen content matched to the desired target material is used. A preferred starting powder is a powder mixture of $MoO_2$ and $MoO_3$, optionally supplemented by small proportions of substoichiometric molybdenum oxides such as, in particular, $Mo_4O_{11}$. Both the oxides, $MoO_2$ and $MoO_3$, are readily available, advantageous raw materials which are thermodynamically stable under ambient conditions and are easy to handle. Substoichiometric oxides can be produced by reduction of $MoO_3$ powder in an appropriate atmosphere such as $H_2$. The starting powders are weighed out in an appropriate ratio in order to obtain a powder mixture having a total oxygen content which corresponds to the oxygen content of the desired target material. The powders are subsequently dry milled and intensively mixed in a mixing chamber. The milling operation can be carried out with addition of milling media in order to break up agglomerates and clumps of particles and accelerate the mixing process. The optional dopant can be mixed as appropriately weighed-out metal powder or appropriately weighed-out metal oxide powder with the molybdenum oxide-containing powder mixture before the milling operation. In the case of tantalum or niobium as dopant, the use of a tantalum oxide or niobium oxide powder ($Ta_2O_5$ or $Nb_2O_5$) offers the advantage that these powders are available in a finer particle size than the corresponding metal powders and a more homogeneous distribution of the dopant in the target material can thereby be achieved. The powder mixture obtained preferably has an average particle size having a diameter of less than 150 µm. To determine the average particle size, it is possible to employ Malvern laser light scattering (in laser light scattering, particle size distributions are determined by measurement of the angle-dependence of the intensity of the scattered light of a laser beam which passes through a dispersed particle sample). The powder mixture produced in this way is introduced into a mould, for example a graphite mould, and subsequently densified, with the densification step being able to be carried out by application of pressure and/or heat, in particular pressure and heat. Suitable densification processes are, for example, spark plasma sintering (SPS), hot pressing, hot isostatic pressing or pressing-sintering. Densification is here carried out at, in particular, temperatures in the range from 600 to 900° C. and pressing pressures in the range from 15 to 110 MPa.

In the case of densification by means of SPS, densification is carried out by means of pressure and heat, with the heat being generated internally by an electric current passed through the powder mixture. SPS has the advantage of high heating and cooling rates and short process times. The densification by means of SPS preferably takes place at temperatures in the range from 600 to 750° C. and pressing pressures in the range from 15 to 45 MPa under reduced pressure or in a protective gas atmosphere (e.g. argon).

In the case of densification by means of hot pressing, densification likewise occurs by means of pressure and heat, with the heat being introduced from the outside through a heated mould. Densification is preferably effected by means of hot pressing at temperatures in the range from 650 to 850° C. and at pressing pressures in the range from 15 to 80 MPa under reduced pressure or in a protective gas atmosphere (e.g. argon).

In densification by means of hot isostatic pressing, densification is likewise effected by means of pressure and heat. Preferred process parameters are temperatures in the range from 650 to 900° C. and pressures in the range from 60 to 110 MPa. The densification of the powder in this case usually takes place in a closed capsule. In densification by means of pressing-sintering, the powder or the powder mixture is pressed to form a green body and this is subsequently sintered by heat treatment below the melting point in a suitable sintering atmosphere.

During the densification process, the starting powders are converted in a solid-state reaction, or depending on chemical composition and process conditions also liquid phase reactions, or multiphase reactions (e.g. solid-liquid), into a multiphase (in the sense of multicomponent) target material. The reactions which proceed are similar to a comproportionation: $MoO_3$ is reduced to various substoichiometric Mo oxides (e.g. $Mo_{18}O_{52}$, $Mo_4O_{11}$, . . . ) while $MoO_2$ is oxidized to various substoichiometric Mo oxides. During the compaction process, $MoO_3$ present in the powder mixture is degraded, i.e. the proportion by volume of the $MoO_3$ phase is significantly decreased. In this way, readily available $MoO_3$ can be used as powder, but, depending on the process conditions, is detectable to a very small extent or not at all in the finished compacted target since it is converted into substoichiometric Mo oxides. The proportion of $MoO_3$, which as described at the outset tends to be disadvantageous in the target material, can thus be decreased or completely avoided. A dopant such as tantalum or niobium used in metallic form is oxidized, generally completely to the respective metal oxide (in the case of Ta to $Ta_2O_5$ or in the case of Nb to $Nb_2O_5$), in a solid-state reaction because of the usually high affinity (oxide formation enthalpy $\Delta H_f$) of the dopant to oxygen. The dopant can also be at least partly present as substoichiometric oxide (e.g. $Ta_2O_{5-y}$ where $0 \leq y \leq 0.05$ or $Nb_2O_{5-y}$ where $0 \leq y \leq 0.05$) or as molybdenum mixed oxide (tantalum-molybdenum mixed oxide or niobium-molybdenum mixed oxide) in the target material. After densification, further mechanical working, for example by means of cutting machining tools, to give the desired final geometry or for surface treatment (setting of a desired roughness of the surface) can take place.

The target material of the invention is preferably used for vapour deposition of molybdenum oxide-containing layers by means of a DC (direct current) sputtering process or a pulsed DC sputtering process. In direct current sputtering, or DC sputtering, a DC voltage is applied between the sputtering target connected as cathode and an anode (generally the housing of the coating plant and/or shielding metal sheets in the vacuum chamber). The DC sputtering process or pulsed DC sputtering process occurs in a noble gas atmosphere, in particular an argon gas atmosphere, preferably nonreactively without additional introduction of oxygen. The layers deposited here have a somewhat lower oxygen content than the target material used because of the abovementioned oxygen depletion in the coating process; the precise oxygen content of the deposited layers depends on the size and structural configuration of the individual coating plant. In order to produce molybdenum oxide layers having an oxygen content higher than that of the target material, the target material can also be sputtered reactively with the introduction of not more than 20% by volume of oxygen. Since the oxygen content of the target material can be set in a wide parameter range and the target material can be matched individually to the respective application, the amount of introduced oxygen is normally comparatively small. The disadvantages of reactive sputtering (hysteresis effects, potential inhomogeneities in the deposited layer) are therefore not as pronounced.

Further advantages and useful aspects of the invention may be derived from the following description of working examples with reference to the accompanying figures.

BRIEF DESCRIPTION OF THE SEVERAL VIEWS OF THE DRAWING

Figure 7:
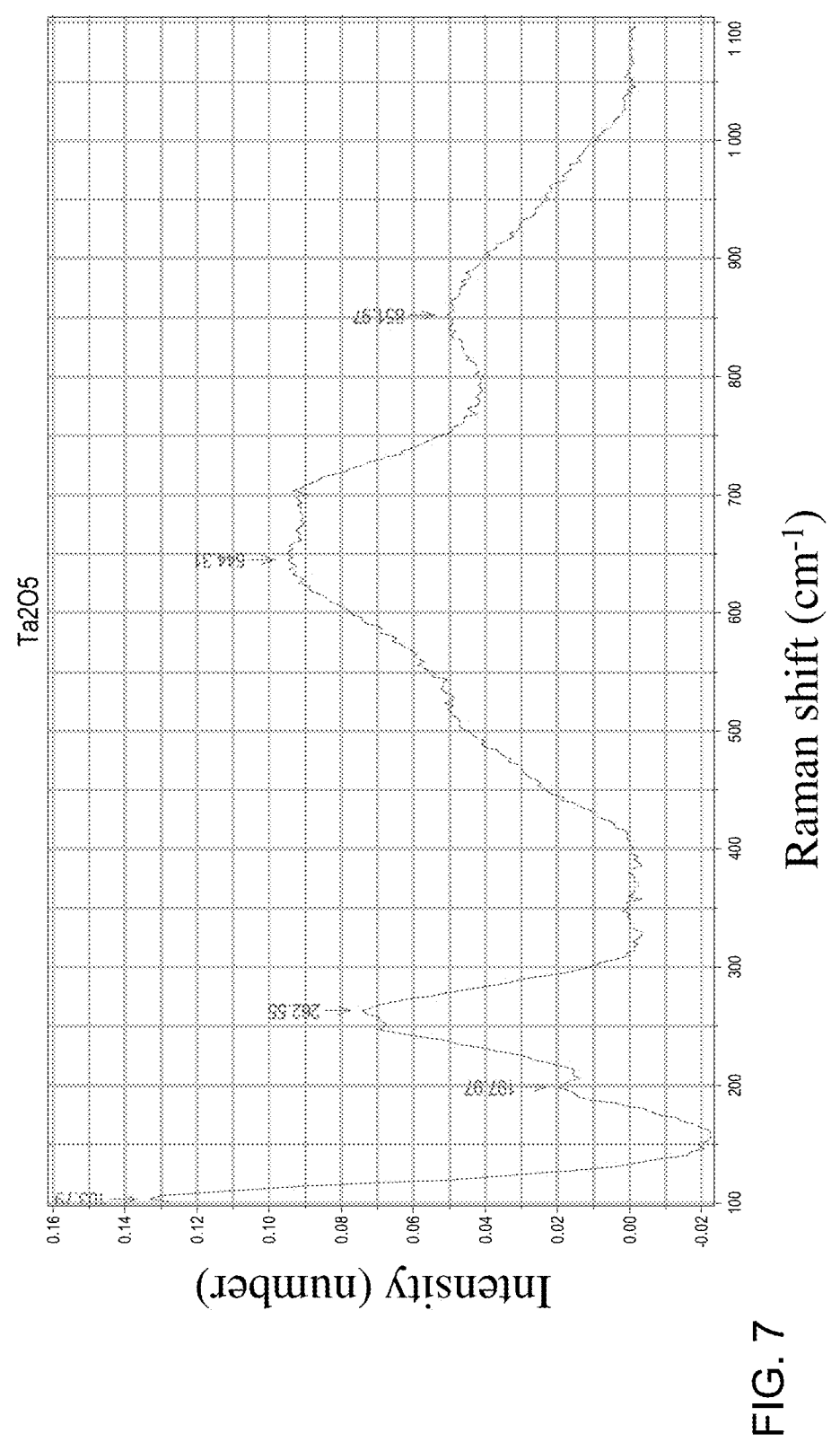

FIG. 7: Raman reference spectrum 6 ($Ta_2O_5$).

WORKING EXAMPLES

Example 1

$MoO_3$ powder (Molymet) having an average particle size of 4.4 μm is reduced at 550° C. in an $H_2$ atmosphere (dew point τ($H_2$)=10° C.) for 17 minutes in a furnace. The Mo oxide powder obtained has an oxygen content of 73.1 at. %. It is placed in a graphite mould having the dimensions 260×240 mm and a height of 50 mm and densified in a hot press under vacuum at a pressing pressure of 45 MPa, a temperature of 750° C. and a hold time of 120 minutes. The compacted component displays a relative density (pore determination on a metallographic polished section) of 96% and comprises an $MoO_2$ phase in a proportion of 10% by volume, an $MoO_3$ phase in a proportion of 7% by volume and a proportion of substoichiometric molybdenum oxide phases of 83% by volume. The substoichiometric molybdenum oxide phase component is formed predominantly by $Mo_4O_{11}$. The determination of the phase composition in this and the following examples is carried out by means of Raman mapping and is explained in detail at the end of the examples.

Example 2

36.2 mol % of $MoO_2$ powder (Plansee) and 63.8 mol % of $MoO_3$ powder (Molymet) are mixed and homogenized for 30 minutes in a ball mill equipped with zirconium oxide mixing balls (diameter 10 mm). The resulting powder mixture having an oxygen content of 72.5 at. % is placed in a graphite mould having a diameter of 70 mm and a height of 50 mm and densified in a spark plasma sintering (SPS) plant under vacuum at a pressing pressure of 40 MPa, a temperature of 775° C. and a hold time of 120 minutes. The compacted component has a relative density of 98%. It consists of an $MoO_2$ phase in a proportion of 2.7% by volume and a proportion of substoichiometric molybdenum oxide phases of 97.3% by volume in total. An $MoO_3$ phase could not be detected. The substoichiometric molybdenum oxide phase component is formed to an extent of 53% by volume by $Mo_4O_{11}$.

Example 3

Figure 1:
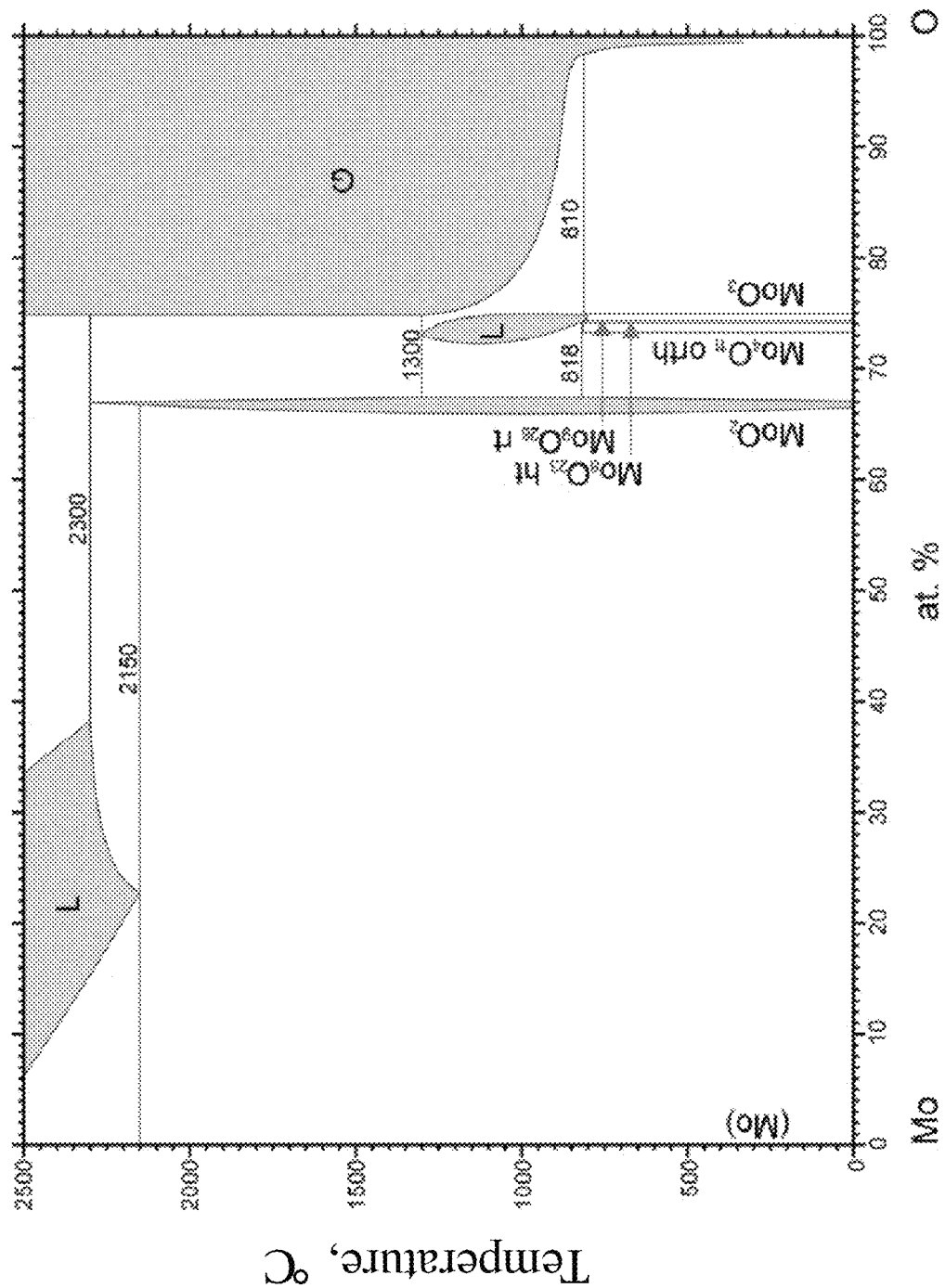
FIG. 1: Binary phase diagram of the molybdenum-oxygen system; source: Brewer L., and Lamoreaux R. H. in Binary Alloy Phase Diagrams, II Ed., Ed. T. B. Massalski, 1990.
Figure 2:
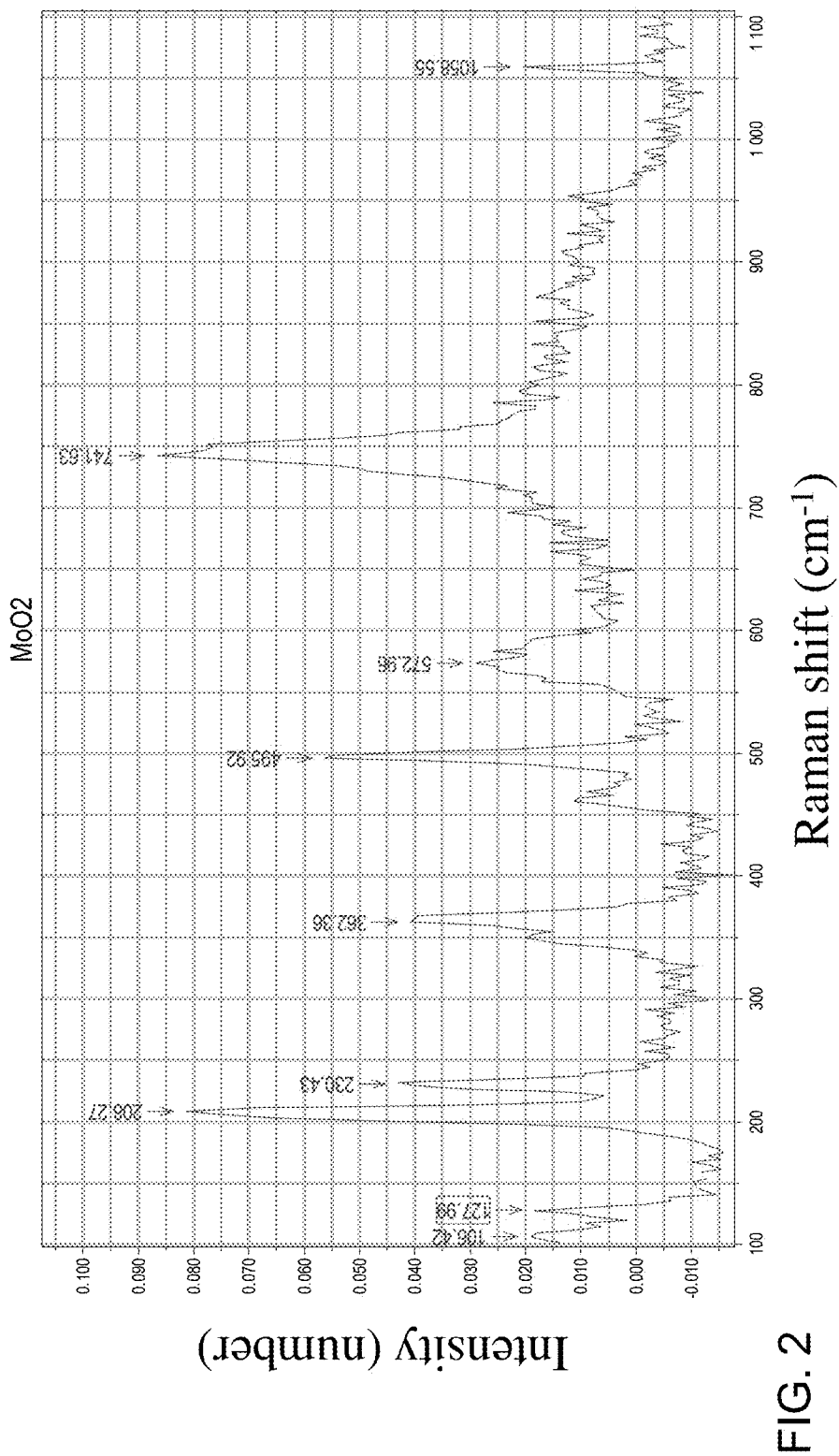
FIG. 2: Raman reference spectrum 1 ($MoO_2$), where the intensity (counts) is plotted against the Raman shift ($cm^{-1}$).
Figure 3:
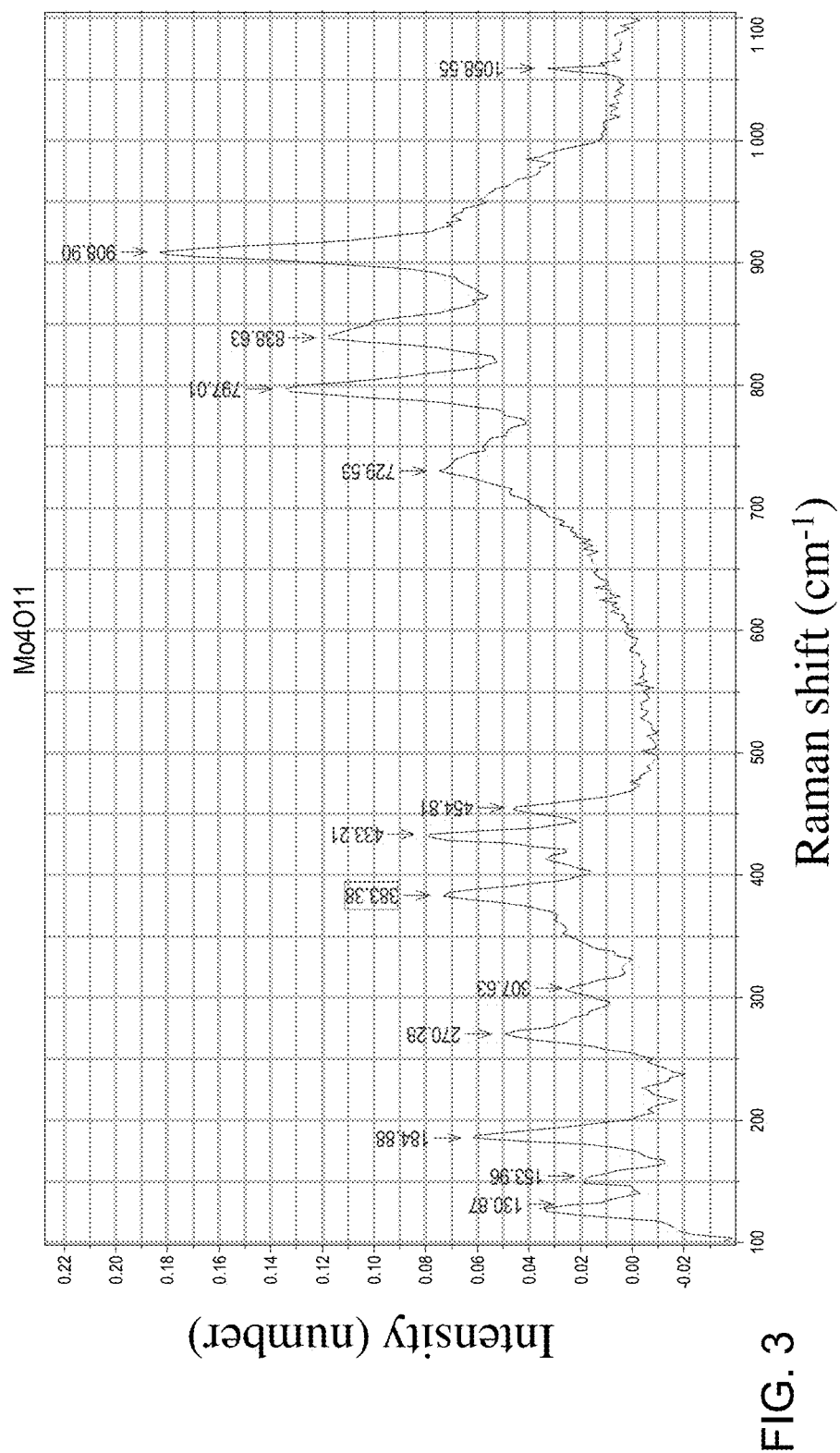
FIG. 3: Raman reference spectrum 2 ($Mo_4O_{11}$).
Figure 4:
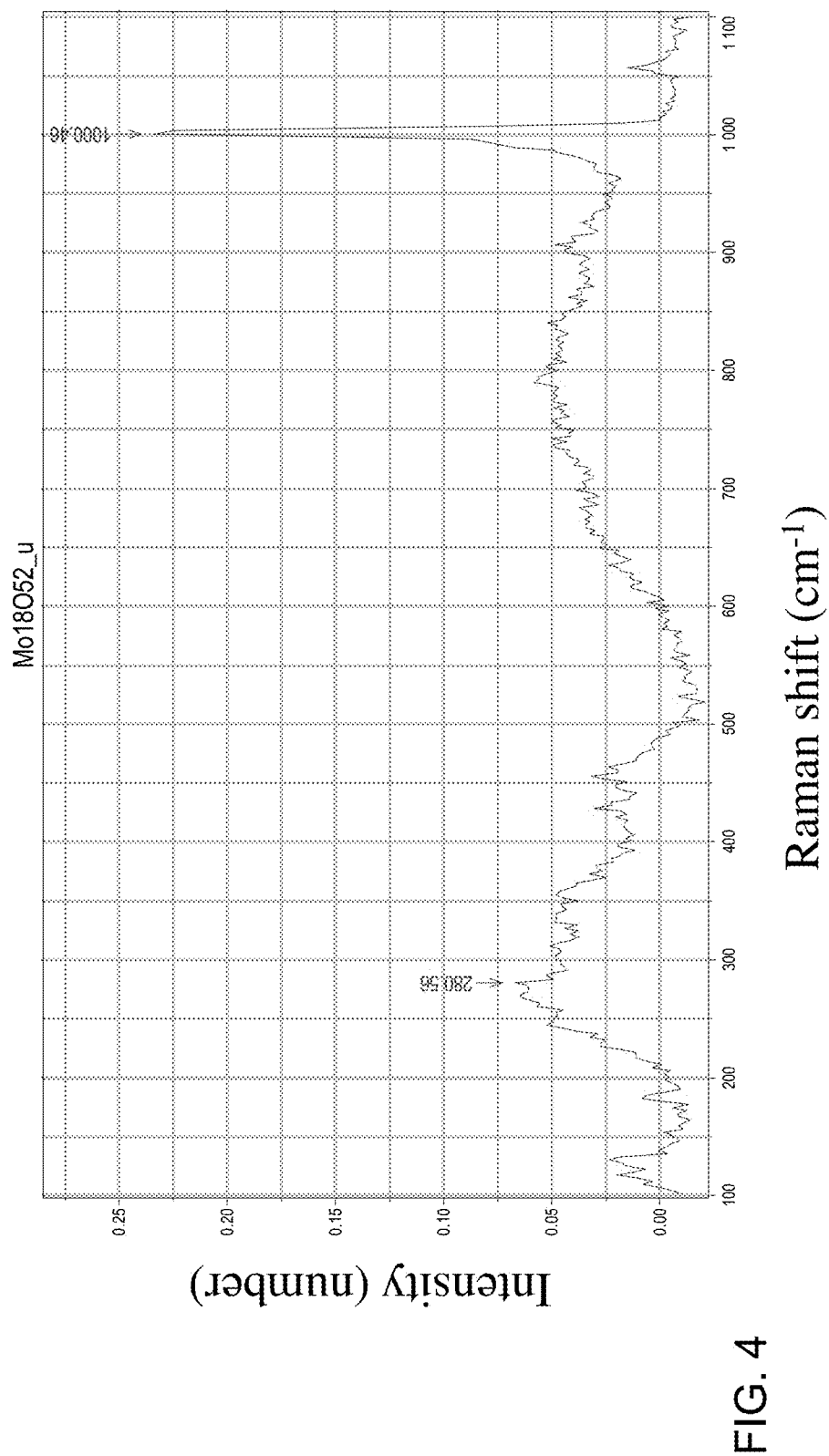
FIG. 4: Raman reference spectrum 3 (presumably $Mo_{18}O_{52}$).
Figure 5:
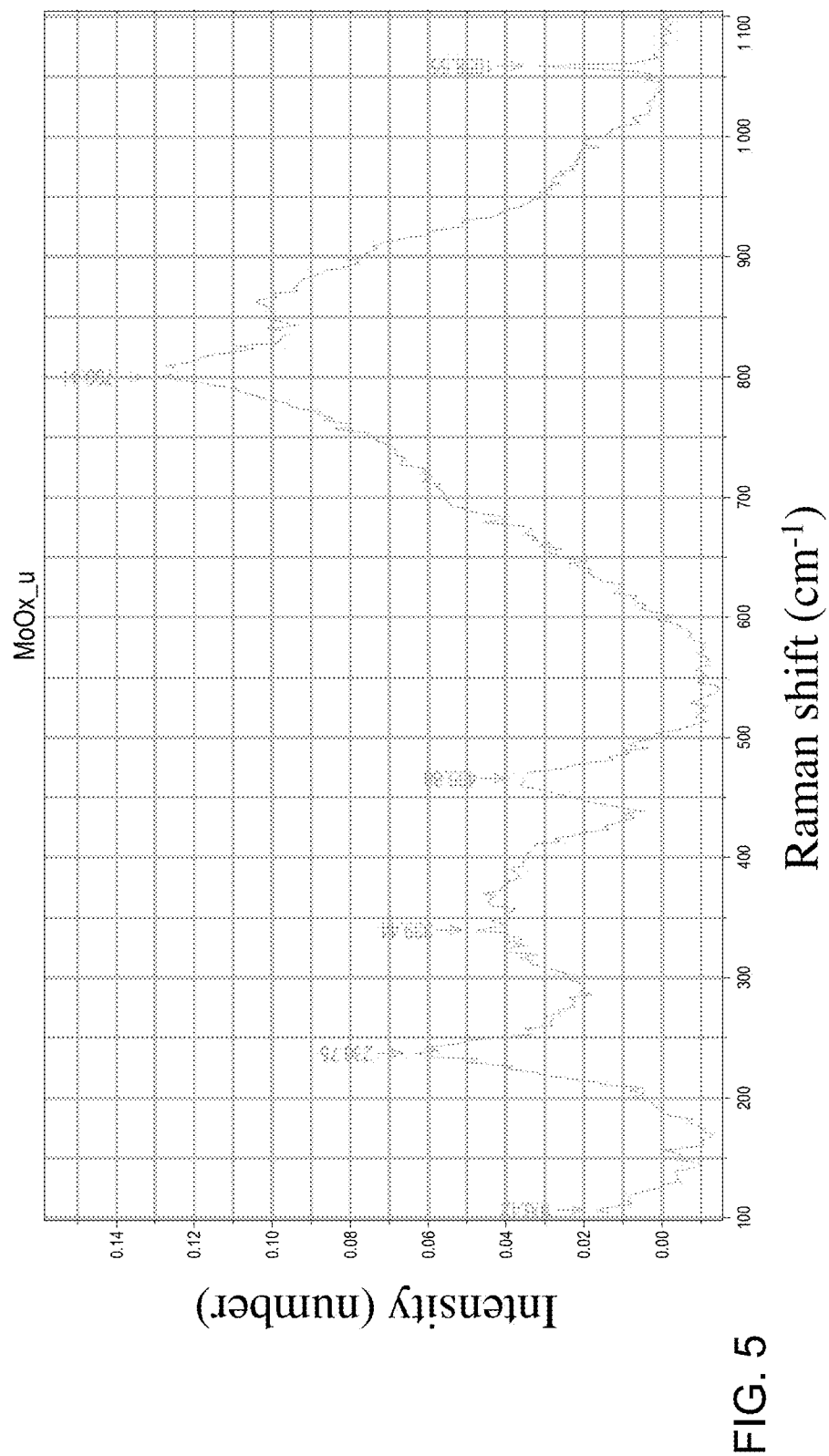
FIG. 5: Raman reference spectrum 4 (substoichiometric molybdenum oxide having an unknown composition, but not $Mo_6O_{14}$, $Mo_8O_{23}$ or $Mo_9O_{26}$).
Figure 6:
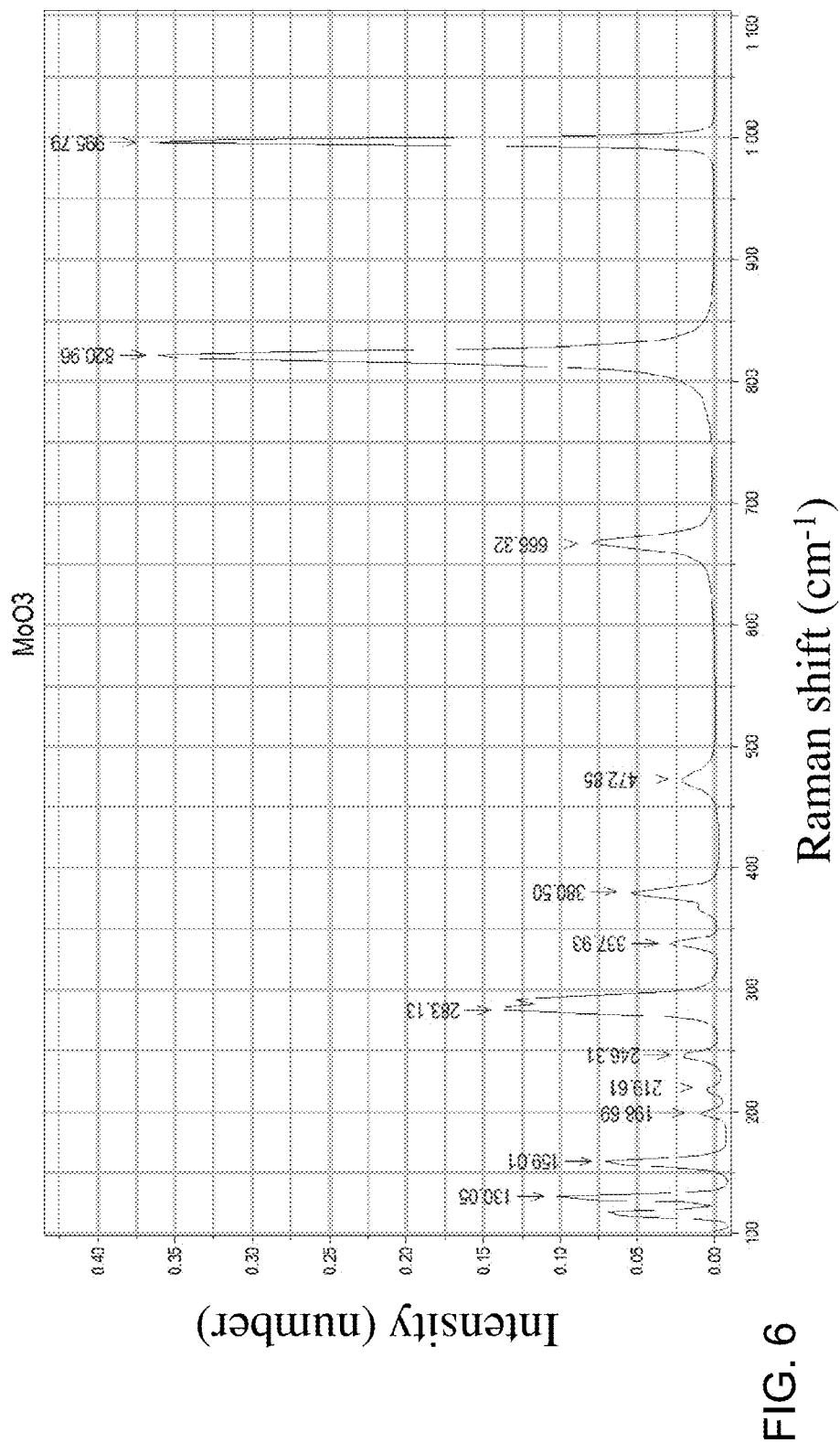
FIG. 6: Raman reference spectrum 5 ($MoO_3$).
Figure 8:
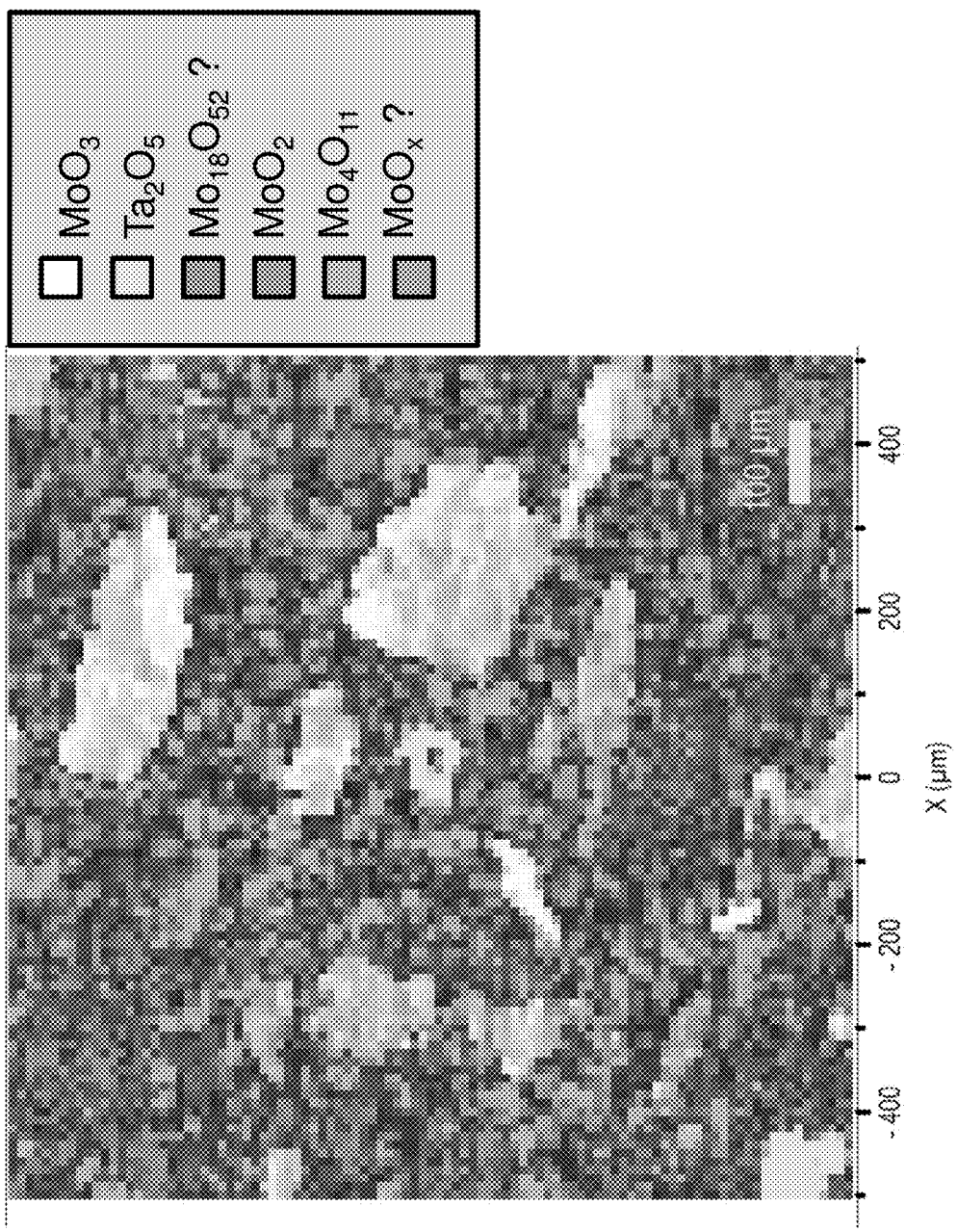
FIG. 8: A microstructure of a third working example produced by means of Raman mapping.

The proportion of coarse particles and agglomerates is sieved out from $MoO_2$ powder (Plansee SE) in a sieve (mesh opening 32 μm). 24 mol % of the $MoO_2$ powder obtained are mixed with 70 mol % of $MoO_3$ powder (Molymet) and 6 mol % of tantalum powder in a ploughshare mixer (Lodige) for 20 minutes so as to obtain a homogeneous distribution between the powder components. The powder mixture obtained is placed in a graphite mould having the dimensions 260×240 mm and a height of 50 mm and densified in a hot press under vacuum at a pressing pressure of 40 MPa, a temperature of 750° C. and a hold time of 60 minutes. The compacted component has a relative density of 95.6%. The target material obtained comprises an $MoO_2$ phase in a proportion of 10.3% by volume, an $MoO_3$ phase in a proportion of 19.2% by volume, substoichiometric molybdenum oxides in a total proportion of 68.4% by volume and a $Ta_2O_5$ phase in a proportion of 2.1% by volume. The predominant component of the substoichiometric molybdenum oxides is $Mo_4O_{11}$ in a proportion of 49.4% by volume. The further substoichiometric molybdenum oxides are (presumably) $Mo_{18}O_{52}$ and a not yet known substoichiometric molybdenum oxide having an unknown composition. The Raman spectrum of this substoichiometric molybdenum oxide is shown in FIG. 5. The microstructure of the target material determined by means of Raman mapping is shown in FIG. 8. Regions comprising $MoO_2$ phase, regions comprising $MoO_3$ phase and regions comprising $Ta_2O_5$ phase are discernible in the microstructure; these various phases are embedded as islands in a contiguous network formed by the substoichiometric molybdenum oxides $Mo_4O_{11}$, $Mo_{18}O_{52}$ and the substoichiometric molybdenum oxide having an unknown composition.

Example 4

Figure 9:
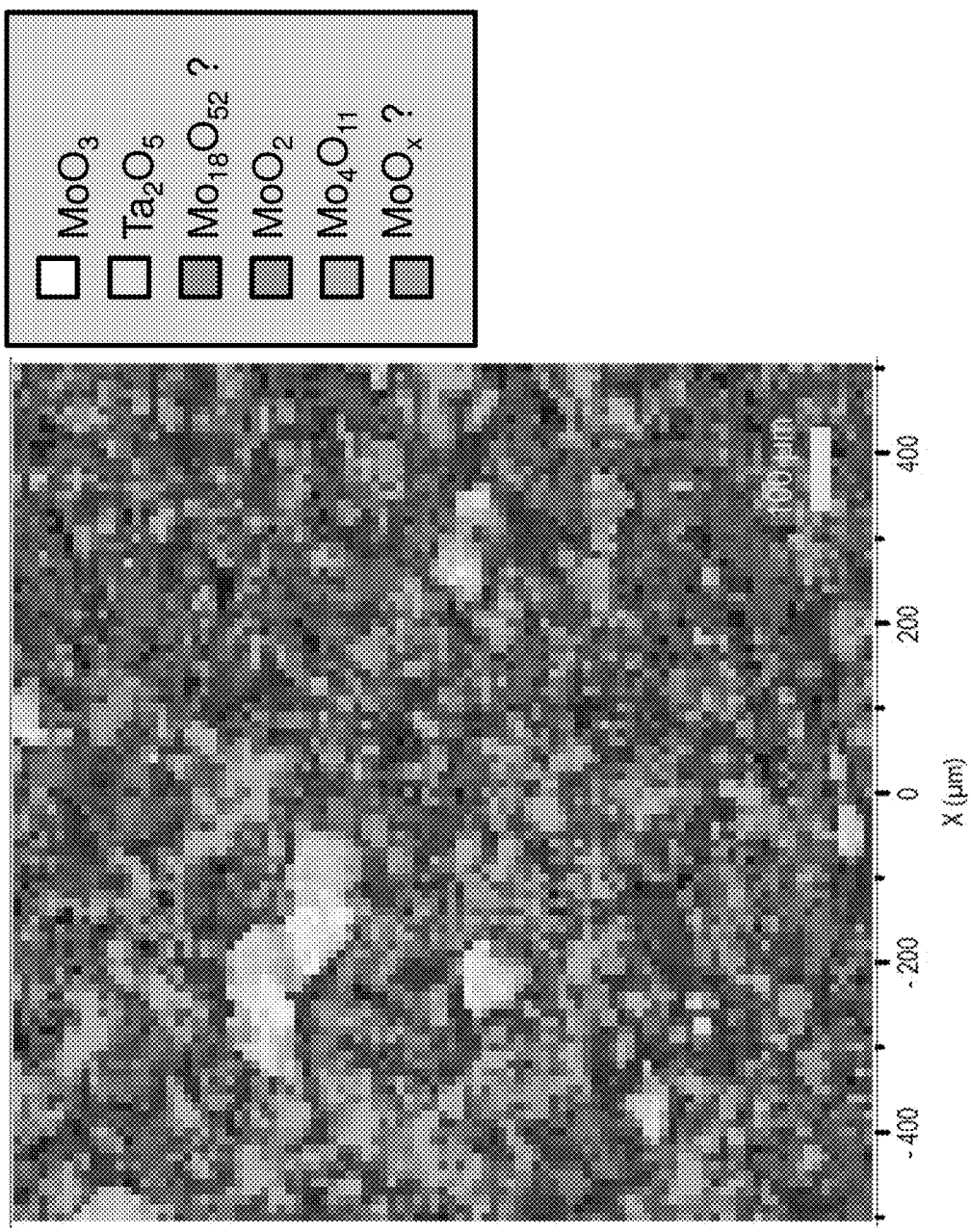
FIG. 9: A microstructure of a fourth working example produced by means of Raman mapping.

Example 4 differs from Example 3 by variation of the hot pressing parameters; manufacture of the powder batch is carried out as in Example 3. The powder mixture is placed in a graphite mould having the dimensions 260×240 mm and a height of 50 mm and densified in a hot press under vacuum at a pressing pressure of 40 MPa, a temperature of 750° C. and a hold time of 240 minutes. The compacted component has a relative density of 97%. The target material obtained comprises an $MoO_2$ phase in a proportion of 8.1% by volume, an $MoO_3$ phase in a proportion of 5.5% by volume, substoichiometric molybdenum oxides in a total proportion of 85% by volume and a $Ta_2O_5$ phase in a proportion of 1.4% by volume. The predominant component of the substoichiometric molybdenum oxides is $Mo_4O_{11}$ in a proportion of 59.1% by volume. FIG. 9 shows the microstructure of the target material produced by means of Raman mapping.

Example 5

Figure 10:
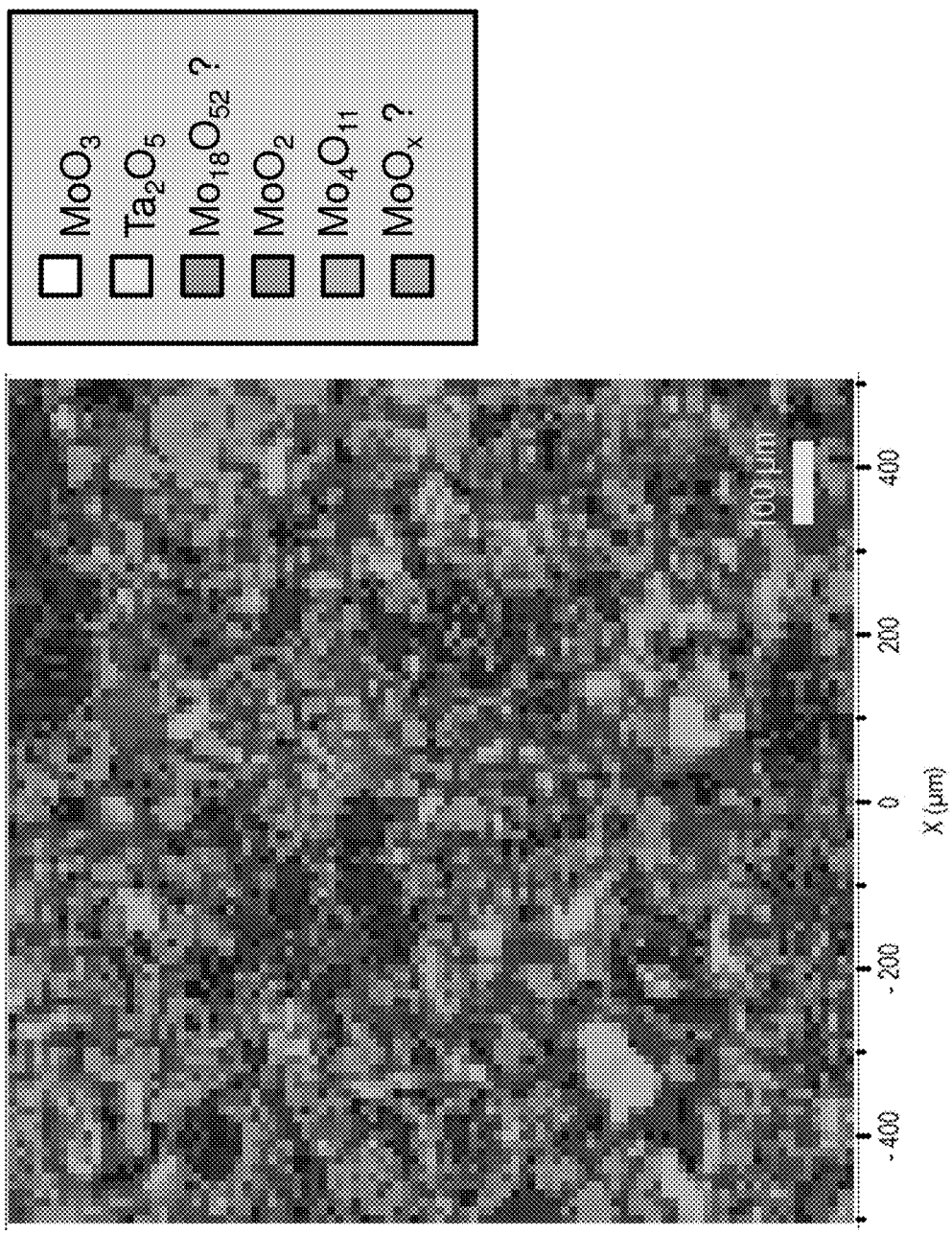
FIG. 10: A microstructure of a fifth working example produced by means of Raman mapping.

Example 5 differs from Examples 3 and 4 by variation of the hot pressing parameters; the manufacture of the powder batch is carried out as in Example 3. The powder mixture is placed in a graphite mould having the dimensions 260×240 mm and a height of 50 mm and densified in a hot press under vacuum at a pressing pressure of 40 MPa, a temperature of 790° C. and a hold time of 120 minutes. The compacted component has a relative density of 99.7%. The target material obtained comprises an $MoO_2$ phase in a proportion of 5.7% by volume, substoichiometric molybdenum oxides in a proportion of 91.9% by volume and $Ta_2O_5$ phase in a proportion of 2.4% by volume. An $MoO_3$ phase is not detectable. Among the substoichiometric molybdenum oxides, $Mo_4O_{11}$ with a proportion of 47.2% by volume and the substoichiometric molybdenum oxide having an unknown composition with a proportion of 31.4% by volume make up the largest part. The Raman spectrum of the still unknown substoichiometric molybdenum oxide is depicted in FIG. 5. The microstructure of the target material produced by means of Raman mapping is shown in FIG. 10.

To determine the proportions by volume of the various phases and the density of the target material, a metallographic polished section was produced by means of dry preparation from a representative part of a specimen by cutting a specimen having an area of about 10-15×10-15 $mm^2$ to size in a dry cutting process (diamond wire saw, bandsaw, etc.), cleaning it by means of compressed air, subsequently embedding it hot and conductively (C-doped) in phenolic resin, grinding and polishing it. Since at least the $MoO_3$ phase proportion is water-soluble, dry preparation is important. The polished section obtained in this way was subsequently analysed under an optical microscope.

For the positionally resolved determination of the molybdenum oxide phases, use was made of a Raman microscope (Horiba LabRAM HR800) in which a confocal optical microscope (Olympus BX41) is coupled with a Raman spectrometer. The surface to be analysed was scanned over an area of 1×1 $mm^2$ by means of a focus laser beam (He—Ne laser, wavelength $\lambda=632.81$ nm, 15 mW total power) point-by-point in steps of 10 μm (the sample surface to be examined was fixed on a motorized XYZ table and the latter was moved). A complete Raman spectrum was produced for each one of the 100×100 measurement points ("Raman mapping"). Raman spectra are obtained from the backscattered radiation and are wavelength-dispersively split up by means of an optical grating (300 lines/mm; spectral resolution: 2.6 $cm^{-1}$) and recorded by means of a CCD detector (1024×256 pixel multichannel CCD; spectral range: 200-1050 nm). In the case of a microscope objective having 10× enlargement and a numerical aperture NA of 0.25, which serves for focussing the laser beam for the Raman spectrometer, it was possible to achieve a theoretical measurement point size of 5.2 $\mu m^2$. The excitation energy density (3 $mW/\mu m^2$) is selected low enough to avoid phase transformations in the specimen. The penetration depth of the excitation radiation is limited to a few microns in the case of molybdenum oxides (in the case of pure $MoO_3$ here about 4 μm; but since a mixture of different phases is analysed, precise indication of the penetration depth is not possible). For each measurement point, the Raman signal was averaged over an acquisition time of 4 s, which gave a sufficiently good signal-to-noise ratio. A two-dimensional depiction of the surface composition of the specimen was produced by automated evaluation of these Raman spectra (evaluation software Horiba LabSpec 6) and the domain size, proportions by area, etc., of the various phases can be determined quantitatively therefrom. For precise identification of a molybdenum oxide phase, reference spectra of previously synthesized reference specimens or reference specimens of relatively large homogeneous specimen regions are recorded, with it being ensured that a reference spectrum corresponds precisely to one metal oxide phase. In FIGS. 2 to 7 typical reference spectra of $MoO_2$, $Mo_4O_{11}$, $Mo_{18}O_{52}$, a previously unknown substoichiometric $MoO_x$ oxide, $MoO_3$ and $Ta_2O_5$ are shown (the intensity (count) of the scattered light versus the Raman shift ($cm^{-1}$) is shown in the individual spectra). The analysis and assignment of the Raman spectra is carried out using the "Multivariant Analysis Modules" of the abovementioned evaluation software by means of the CLS method (classical least squares fitting). The specimen spectrum S is for this purpose represented as a linear combination of the individual normalized reference spectra $R_i$, where $c_i$ is the respective weighting factor and $\Delta$ is an offset value, $S=\Sigma c_i R_i+\Delta$. A colour corresponding to a metal oxide phase is subsequently assigned to each measurement point, with only the phase having the greatest weighting factor $c_i$ being used for the colour assignment in each case. The magnitude (the absolute value) of the weighting factor $c_i$ determines the brightness of the measurement point. This procedure is justified since the spectrum of one measurement point can generally be unambiguously assigned to a single metal oxide phase.

For the objective used, a specimen spectra was obtained from all 100×100 measurement points, even when the measurement was made on a pore. In this case, the signal originated from a lower region located under the pore. If no Raman spectrum is obtained for individual measurement points, e.g. owing to a pore, this can be excluded from the determination of the proportions by area, i.e. the volume occupied by the pores of the target material is excluded from the total volume. The reported volumes for the individual molybdenum oxide phases therefore on their own add up to 100% without the pore volume.

The method of analysis described here is particularly suitable for determining the relative proportions of the phase of various Mo oxides. In a repeat measurement (one specimen was measured 3 times in succession), a relative measurement error of ±10% (based on the phase component determined in each case) was found. The relative measurement error in the % by volume determination of the dopant oxides (e.g. $Ta_2O_5$) on the other hand was ±25%. It is therefore possible that the measured percentages by volume in the examples deviate slightly from the weighed-out amounts of dopant metal (e.g. tantalum) or dopant metal oxide (e.g. $Ta_2O_5$).

The determination of the relative density is carried out by means of digital image analysis of optical micrographs of the metallographic polished section, in which the relative proportion by area of the pores is determined. For this purpose, preparation of the specimens was followed by recording of in each case three bright field micrographs having a size of 1×1 mm with 100× enlargement, with zones of obvious cavities or other damage such as scratches caused by dry preparation being avoided where possible. The images obtained were evaluated by means of the digital image analysis software implemented in the IMAGIC image data bank. For this purpose, the pore component (dark) was marked on the image as a function of the grey scale by means of a histogram. The lower limit of the interval was set at 0 (=black). On the other hand, the upper limit has to be estimated subjectively with the aid of the grey scale intensity histogram (255=white). The image region to be measured was set (ROI) in order to exclude the scale bars. The relative proportion by area (in percent) and the image coloured according to the selected grey scale interval (coloured means that this pixel was included in the measurement and accordingly counted as pore) is obtained as result. The value for the relative density was determined as arithmetic mean of three such porosity measurements.

Example 6

Figure 11:
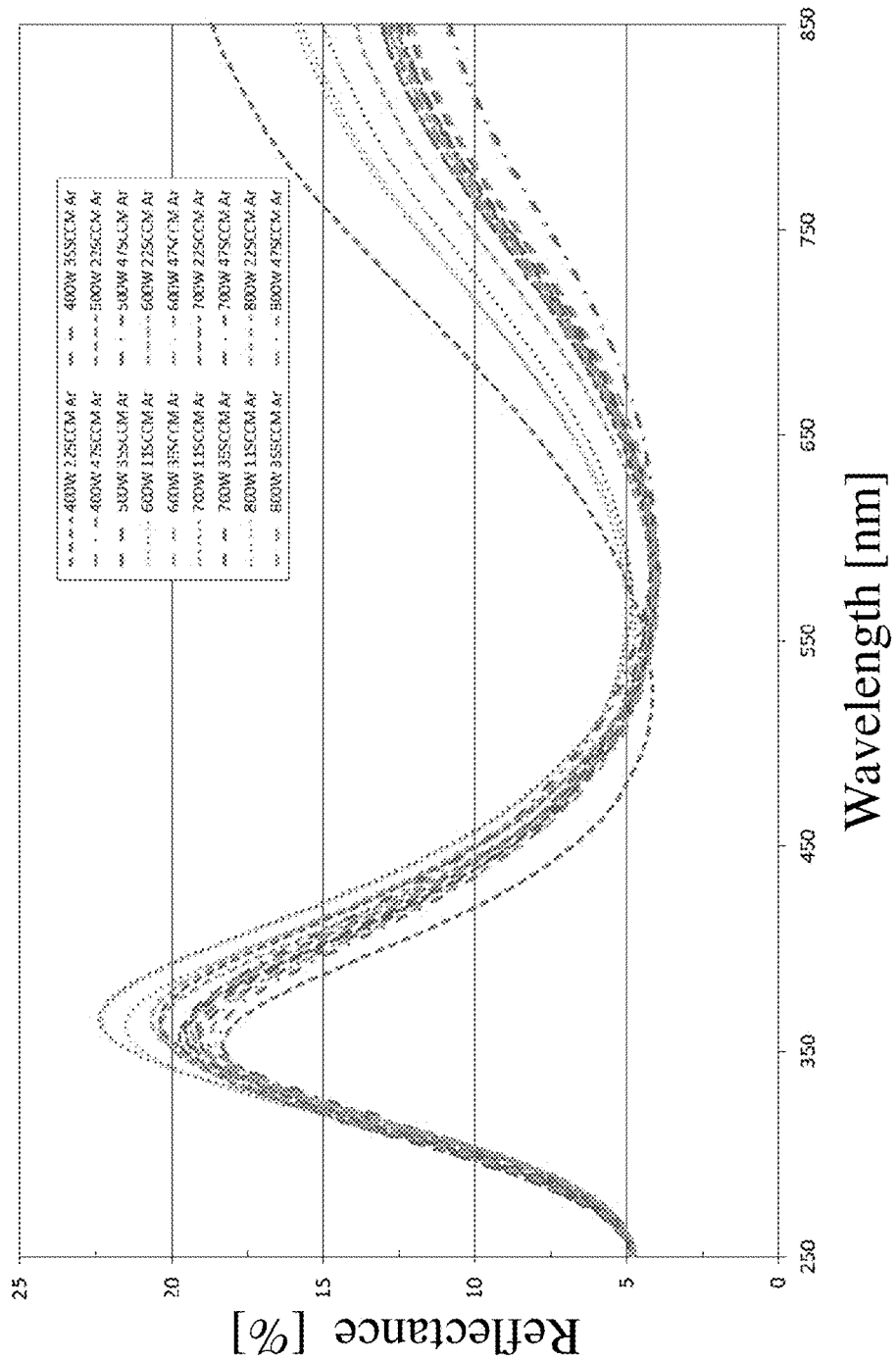
FIG. 11: Reflection properties of a molybdenum-tantalum oxide layer deposited under different process parameters (sputtering power, process gas pressure).

In a series of experiments, the molybdenum-tantalum oxide target produced as described in Example 3 was nonreactively sputtered under different process conditions in order to check the reproducibility and process stability by means of the properties of the layer. Here, the reflectivity of the layers produced was used as criterion for the assessment. To determine the reflectivity, glass substrates (Corning Eagle XG, 50×50×0.7 mm$^3$) were coated with molybdenum-tantalum oxide and a covering layer of 200 nm of Al. The reflection was measured through the glass substrate using a Perkin Elmer Lambda 950 photospectrometer. In order to obtain a very low reflectivity, the layer thickness of the molybdenum oxide was varied in the range from 40 to 60 nm in a first experiment, with the best result being able to be achieved at a layer thickness of 51 nm. This layer thickness was subsequently used and kept constant for all further experiments. Results from this series of experiments are shown in FIG. 11. In the experiments, the sputtering power was varied in the range from 400 W to 800 W and the process pressure of the argon was varied in the range from $2.5 \times 10^{-3}$ mbar (11 sccm) to $1.0 \times 10^{-2}$ mbar (47 sccm). It can be seen that both the increase in the power by a factor of 2 from 400 W to 800 W and also the increase in the process pressure by a factor of 2 from $5 \times 10^{-3}$ mbar to $1 \times 10^{-2}$ mbar have only a negligible influence on the measured properties of the layer.

The high process stability of the sputtering process using a molybdenum-tantalum oxide target was thus confirmed. Reproducible results can be achieved in a wide process window, in complete contrast to the reactive sputtering process using a metallic target, which is highly unstable.

The invention claimed is:

1. An electrically conductive, oxidic target material configured for sputtering, comprising:
    a proportion of substoichiometric molybdenum oxide phases of at least 60% by volume, based upon a total volume of solid material in the electrically conductive, oxidic target material comprising substoichiometric $MoO_{3-y}$ phases, where y is in each case in a range of from 0.05 to 0.25;
    an $MoO_2$ phase in a proportion of 2-20% by volume, based upon the total volume of solid material in the electrically conductive, oxidic target material; and
    a proportion of an $MoO_3$ phase being ≤1% by volume, based upon the total volume of solid material in the electrically conductive, oxidic target material,
    wherein the electrically conductive, oxidic target material is a sintered material having a relative density of at least 95%,
    wherein the electrically conductive, oxidic target material further comprises a metal other than molybdenum present in metallic or oxidic form as a dopant in an amount of from 0.5 mol % to 20 mol %,
    wherein the dopant is a metal selected from the group consisting of tantalum, niobium, titanium, chromium, zirconium, vanadium, hafnium, and tungsten, and
    wherein the electrically conductive, oxidic target material has an oxygen content in a range of from 71.4 to 74.5 at. %.

2. The electrically conductive, oxidic target material according to claim 1, wherein the proportion of the substoichiometric molybdenum oxide phases is at least 85% by volume, based upon the total volume of solid material in the electrically conductive, oxidic target material, and the proportion of the $MoO_2$ phase is in a range of 2-15% by volume.

3. The electrically conductive, oxidic target material according to claim 1, wherein the proportion of substoichiometric molybdenum oxide phases is formed by at least one substoichiometric phase $MO_4O_{11}$, $MO_{17}O_{47}$, $MO_5O_{14}$, $MO_8O_{23}$, $MO_9O_{26}$ or $MO_{18}O_{52}$.

4. The electrically conductive, oxidic target material according to claim 3, wherein the substoichiometric phase $Mo_4O_{11}$ is at least 45% by volume, based upon the total volume of solid material in the electrically conductive, oxidic target material.

5. The electrically conductive, oxidic target material according to claim 1, wherein the dopant is tantalum.

6. The electrically conductive, oxidic target material according to claim 1, wherein the dopant is niobium.

7. The electrically conductive, oxidic target material according to claim 1, wherein the electrically conductive, oxidic target material has a relative density of >98%.

8. A process for producing the electrically conductive, oxidic target material according to claim 1, the process comprising the following steps:
    providing a molybdenum oxide-containing powder or a molybdenum oxide-containing powder mixture having an oxygen content matched to the electrically conductive, oxidic target material to be produced;
    introducing the powder mixture into a mold; and
    densifying the powder mixture by pressure, heat, or pressure and heat.

9. The process according to claim 8, which further comprises carrying out the densifying step by hot pressing, hot isostatic pressing, spark plasma sintering or pressing-sintering.

10. A process for using the electrically conductive, oxidic target material according to claim 1, the process comprising the following step:
    carrying out a sputtering process as a DC sputtering process or a pulsed DC sputtering process in a noble gas atmosphere without oxygen or with an introduction of not more than 20% by volume of oxygen as a reactive gas.

* * * * *